(12) United States Patent
Thewes et al.

(10) Patent No.: US 9,576,642 B2
(45) Date of Patent: Feb. 21, 2017

(54) MEMORY DEVICE WITH DYNAMICALLY OPERATED REFERENCE CIRCUITS

(71) Applicant: Soitec, Crolles (FR)

(72) Inventors: Roland Thewes, Puchheim (DE); Richard Ferrant, Esquibien (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/785,955

(22) PCT Filed: Apr. 24, 2014

(86) PCT No.: PCT/EP2014/058399
§ 371 (c)(1),
(2) Date: Oct. 21, 2015

(87) PCT Pub. No.: WO2014/174046
PCT Pub. Date: Oct. 30, 2014

(65) Prior Publication Data
US 2016/0086652 A1 Mar. 24, 2016

(30) Foreign Application Priority Data

Apr. 24, 2013 (FR) .................................. 13 53717

(51) Int. Cl.
*G11C 7/00* (2006.01)
*G11C 11/4091* (2006.01)
(Continued)

(52) U.S. Cl.
CPC ............. *G11C 11/4091* (2013.01); *G11C 7/04* (2013.01); *G11C 7/06* (2013.01); *G11C 7/062* (2013.01);
(Continued)

(58) Field of Classification Search
CPC ............... G11C 7/04; G11C 7/06; G11C 7/08; G11C 7/14; G11C 7/18; G11C 11/4091; G11C 11/4097; G11C 11/4099
See application file for complete search history.

(56) References Cited

U.S. PATENT DOCUMENTS

| 6,788,563 B2 * | 9/2004 | Thompson | ........... G11C 27/026 365/145 |
| 2005/0105358 A1 * | 5/2005 | Schweickert | .......... G11C 7/062 365/222 |

(Continued)

FOREIGN PATENT DOCUMENTS

| EP | 2365487 A2 | 9/2011 |
| WO | 2004086406 A1 | 10/2004 |

OTHER PUBLICATIONS

French Preliminary Search Report for French Application No. FR1353717 dated Dec. 6, 2013, 2 pages.

(Continued)

*Primary Examiner* — Toan Le
(74) *Attorney, Agent, or Firm* — Kunzler Law Group (57) ABSTRACT

This invention concerns a semiconductor memory device comprising: at least one sense amplifier circuit for reading data sensed from selected memory cells in a memory array,—at least one reference circuit, each reference circuit being a replica of the sense amplifier circuit and having an output through which the reference circuit delivers an output physical quantity, a regulation network providing a regulation signal to each sense amplifier circuit and each reference circuit, wherein the regulation signal is derived from an averaging of the output physical quantity over time and/or space, wherein the regulation network comprises a control unit configured to sum up the physical quantities of each output of the reference circuit and a target mean value, the control unit delivering a regulation signal based on the sum, (Continued)

the regulation signal being fed in to each regular sense amplifier circuit and to each reference circuit.

20 Claims, 4 Drawing Sheets

(51) Int. Cl.
    *G11C 7/18*     (2006.01)
    *G11C 7/06*     (2006.01)
    *G11C 7/04*     (2006.01)
    *G11C 7/08*     (2006.01)
    *G11C 7/14*     (2006.01)
    *G11C 11/4099*     (2006.01)
    *G11C 11/4096*     (2006.01)

(52) U.S. Cl.
    CPC . *G11C 7/08* (2013.01); *G11C 7/14* (2013.01); *G11C 7/18* (2013.01); *G11C 11/4096* (2013.01); *G11C 11/4099* (2013.01)

(56) References Cited

U.S. PATENT DOCUMENTS

2014/0241091 A1\*   8/2014   Choy .................. G11C 11/4074
                                                                                                            365/207
2015/0279448 A1\*   10/2015   Thewes .................. G11C 5/146
                                                                                                             365/210.1

OTHER PUBLICATIONS

International Preliminary Report on Patentability for International Application No. PCT/EP2014/058399 dated Oct. 27, 2015, 5 pages.
International Written Opinion for International Application No. PCT/EP2014/058399 dated Jul. 4, 2014, 3 pages.
International Search Report for International Application No. PCT/EP2014/058399 dated Jun. 24, 2014, 3 pages.

\* cited by examiner

MEMORY DEVICE WITH DYNAMICALLY OPERATED REFERENCE CIRCUITS

CROSS-REFERENCE TO RELATED APPLICATIONS

This application is a national phase entry under 35 U.S.C. §371 of International Patent Application PCT/EP2014/058399, filed Apr. 24, 2014, designating the United States of America and published in English as International Patent Publication WO 2014/174046 A1 on Oct. 30, 2014, which claims the benefit under Article 8 of the Patent Cooperation Treaty and under 35 U.S.C. §119(e) to French Patent Application Serial No. 1353717, filed Apr. 24, 2013, the disclosure of each of which is hereby incorporated herein in its entirety by this reference.

TECHNICAL FIELD

The invention relates to a semiconductor memory device comprising at least a single-ended sense amplifier, and more particularly to the provision of at least a reference circuit from which a regulation signal is generated to be applied to the sense amplifier and the reference circuit in order to compensate for the effects of variation of operating conditions (e.g., temperature, supply voltage) or process (e.g., ratio of NMOS/PMOS current drive capability, etc.).

BACKGROUND

Memory read operation in all kinds of sense amplifiers is achieved by comparing input data with a reference signal to determine the logic state of the input data. Conventional differential sense amplifiers, which are used in memory devices such as standard Dynamic Random Access Memory (DRAM) devices, are connected to two bit lines, one bit line providing the data to be read while the other bit line is used for reference voltage generation.

In contrast to that, single-ended sense amplifiers, which are used in memory devices such as embedded or special Dynamic Random Access Memory (DRAM) devices, are coupled to a single bit line only.

Figure 1:
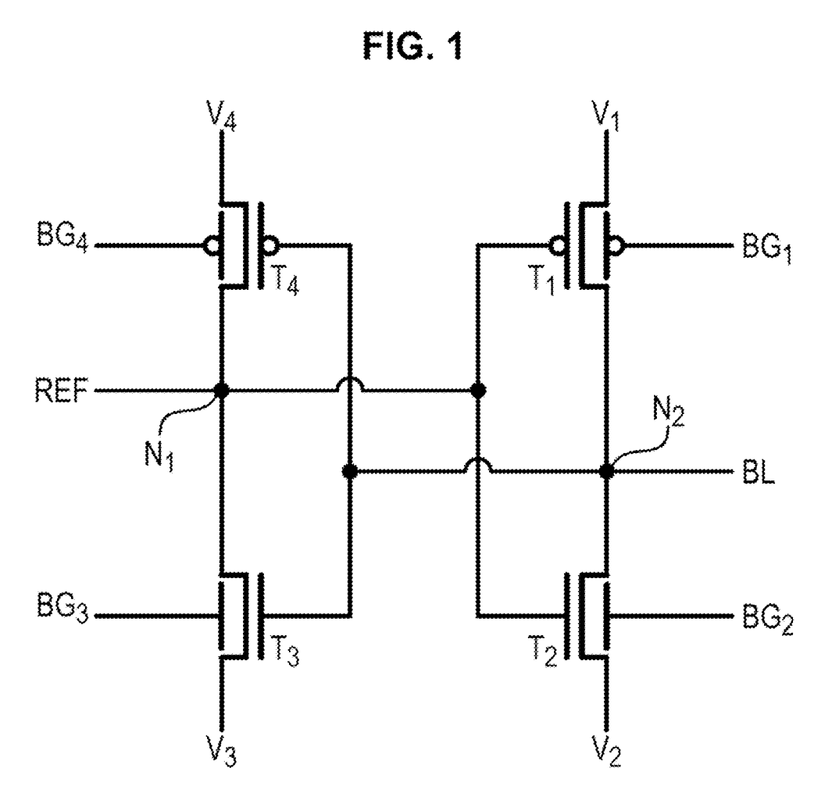
FIG. 1 already discussed above shows a single-ended sense amplifier as introduced in publication EP 2 365 487 A2.

A particular style of single-ended sense amplifier employs a sense amplifier with two input/output nodes, one of which is coupled to an input data line (bit line), and the other is used to feed in a reference signal required for the read operation process. FIG. 1 shows an example of such a single-ended sense amplifier which has been proposed by the Applicant and previously described in publication EP 2 365 487 A2. It comprises two branches, each having a PMOS transistor and a NMOS transistor connected in series, arranged in a way that they form cross-coupled inverters. The transistors are double gate transistors having a first control gate and a second control gate that can be independently operated. The first branch comprises PMOS transistor $T_4$ in series with NMOS transistor $T_3$ in between power supplies $V_4$ and $V_3$, while the second branch comprises PMOS transistor $T_1$ in series with NMOS transistor $T_2$ in between power supplies $V_1$ and $V_2$. The first gates of transistors $T_1$ and $T_2$ are connected together (input of the inverter formed by the second branch) and connected to the middle node between transistors $T_3$ and $T_4$ (output of the inverter formed by the first branch), thereby forming a first input/output node $N_1$ of the sense amplifier which is used to feed in a reference signal REF. The first gates of transistors $T_4$ and $T_3$ are connected together (input of the inverter formed by the first branch) and to the middle node between transistors $T_1$ and $T_2$ (output of the inverter formed by the second branch), thereby forming a second input/output node $N_2$ of the sense amplifier which is coupled to a bit line BL. The second gates of transistors $T_1$, $T_2$, $T_3$ and $T_4$ are denoted $BG_1$, $BG_2$, $BG_3$ and $BG_4$ and are herein referred to as back control gates. Such back control gates are used to modulate the first-gate-related threshold voltages of their respective transistors.

A problem arises from the fact that such a circuit is not necessarily symmetrical or, depending on the particular operation principle, is by purpose designed asymmetrically. Indeed both branches may have different designs concerning dimensions of the respective transistors ($T_1$ being compared to $T_4$, and $T_2$ being compared to $T_3$). Moreover, the first and second nodes $N_1$, $N_2$ may be operated in a different manner and with different loads (with nodes $N_1$ and $N_2$ being either both inputs or both outputs), and the operating points of all transistors may differ from each other during the sensing process (once again $T_1$ is compared to $T_4$, and $T_2$ to $T_3$). Note that these asymmetries usually apply to the operation of a single-ended sense amplifier. Thus, for ensuring proper operation of the circuit, widths and lengths of the transistors must be thoroughly chosen (and $T_1$ and $T_4$, respectively, $T_2$ and $T_3$, may intentionally differ). Reference, bias, and supply voltage must also be well defined and well controlled, too.

In practice however, all these parameters and the transistor properties (current drive capability, threshold voltage, transconductance, drain conductance, etc.) are prone to variations (PVT: process, voltage, temperature). As the single-ended sense amplifier is usually designed and operated as a non-symmetrical circuit, PVT variations do not compensate for each other in the two branches and malfunction of the circuit may result.

Generally speaking, this problem occurs in the case of any sense amplifier that does not rely on a fully-symmetrical differential circuit structure, and more specifically for sense amplifier circuits sensing a bitline against a reference voltage, i.e., against a non in-situ generated reference, which is not the case for sense amplifiers that generate their own references through shorting first and second bitlines in a precharge/equalizing phase or at least by precharging them to same potentials before a sense process is started.

BRIEF SUMMARY

The invention aims to provide a single-ended sense amplifier together with supporting circuitry and an operation principle, so that the single-ended sense amplifier is not prone to PVT variations.

In this respect, the invention relates, according to its first aspect, to a semiconductor memory device comprising:
- at least one sense amplifier circuit for reading data sensed from selected memory cells in a memory array;
- at least one reference circuit, each reference circuit being a replica of the sense amplifier circuit and having an output through which the reference circuit delivers an output physical quantity;
- a regulation network providing a regulation signal to each sense amplifier circuit and each reference circuit, wherein the regulation signal is derived from an averaging over time and/or space of the output physical quantity;
- wherein the regulation network comprises a control unit configured to sum up the physical quantities of each output of the reference circuit and a target mean value, wherein the physical quantities of the output of the reference circuit and the target mean value are summed up with opposite signs, the control unit delivering a regulation signal based on the sum, the regulation signal being fed in to each regular sense amplifier circuit and to each reference circuit.

Other preferred, although non limitative, aspects of this memory device are as follows:
- the target mean value is a voltage of VL+(VH−VL)/2, with VL and VH, respectively, being low and high voltage levels of the operating voltages of the sense amplifier circuits and reference circuits, defining the respective low and high logic levels;
- each of the reference circuit outputs is connected to a capacitor connected to a DC voltage source;
- the regulation signal is an average over time of the difference between the sum of the output physical quantities of each reference circuit and the target mean value;
- the regulation signal is a voltage used as a regulation voltage by each sense amplifier circuit and by each reference circuit;
- the control unit comprises an operational amplifier with an inverting input and a non-inverting input, the target mean value being applied to the non-inverting input while the inverting input is connected to each reference circuit output through at least one switch and/or resistor and/or capacitor;
- each reference circuit output is connected to the control unit through at least one switch that allows decoupling the control unit from the output prior and during sensing operations of the at least one sense amplifier circuit and of the at least one reference circuit;
- the control unit comprises an integrator;
- the integrator comprises resistors connected to each reference circuit output and to a summing node, and a common integration capacitor;
- the integrator comprises a switched capacitor configuration associated with each reference circuit output;
- the control unit comprises:
  - a digital up/down counter, each reference circuit output being connected to an input of the digital up-down counter;
  - a Digital-to-Analog Converter for converting the digital output signal of the digital up/down counter into the regulation signal to be fed in to each sense amplifier circuit and to each reference circuit.

The invention further relates to a semiconductor memory incorporating a semiconductor memory device of the invention, as well as to a process of operating a semiconductor memory device of the invention.

The invention also relates to a process of operating a semiconductor memory device of the invention, comprising the steps of:
- operating similarly each sense amplifier circuit and each reference circuit;
- generating a regulation signal in the regulation network from the physical quantities of each output of the reference circuits and applying the regulation signal to the sense amplifier circuit and to the reference circuits.

BRIEF DESCRIPTION OF THE DRAWINGS

Other aspects, objects and advantages of the present invention will become better apparent upon reading the following detailed description of preferred embodiments thereof, given as a non-limiting example, and made with reference to the appended drawings wherein.

DETAILED DESCRIPTION

The invention relates to a semiconductor memory device comprising at least one sense amplifier circuit for reading data sensed from selected memory cells in a memory array and at least one reference circuit. Each one of the reference circuits is a replica of the sense amplifier circuits and is coupled to a control unit. Stated briefly, the control unit is designed and operated so as to generate a regulation signal fed to the sense amplifier circuits to compensate for all kinds of PVT variation induced drifts and to maintain correct operation of the sense amplifier circuits independent of PVT variations.

It shall be noted that the semiconductor memory device of the invention may comprise only one sense amplifier circuit and/or reference circuit. However, for the sake of comprehensiveness, the following description will be made in reference to an embodiment comprising a plurality of sense amplifier circuits and reference circuits. For ease of representation, the plurality of sense amplifier circuits and reference circuits are discriminated by a subscript number from 1 to n with index "i" corresponding to an integer number between 1 and n, and 1 to m with index "j" corresponding to an integer number between 1 and m, respectively.

Figure 2:
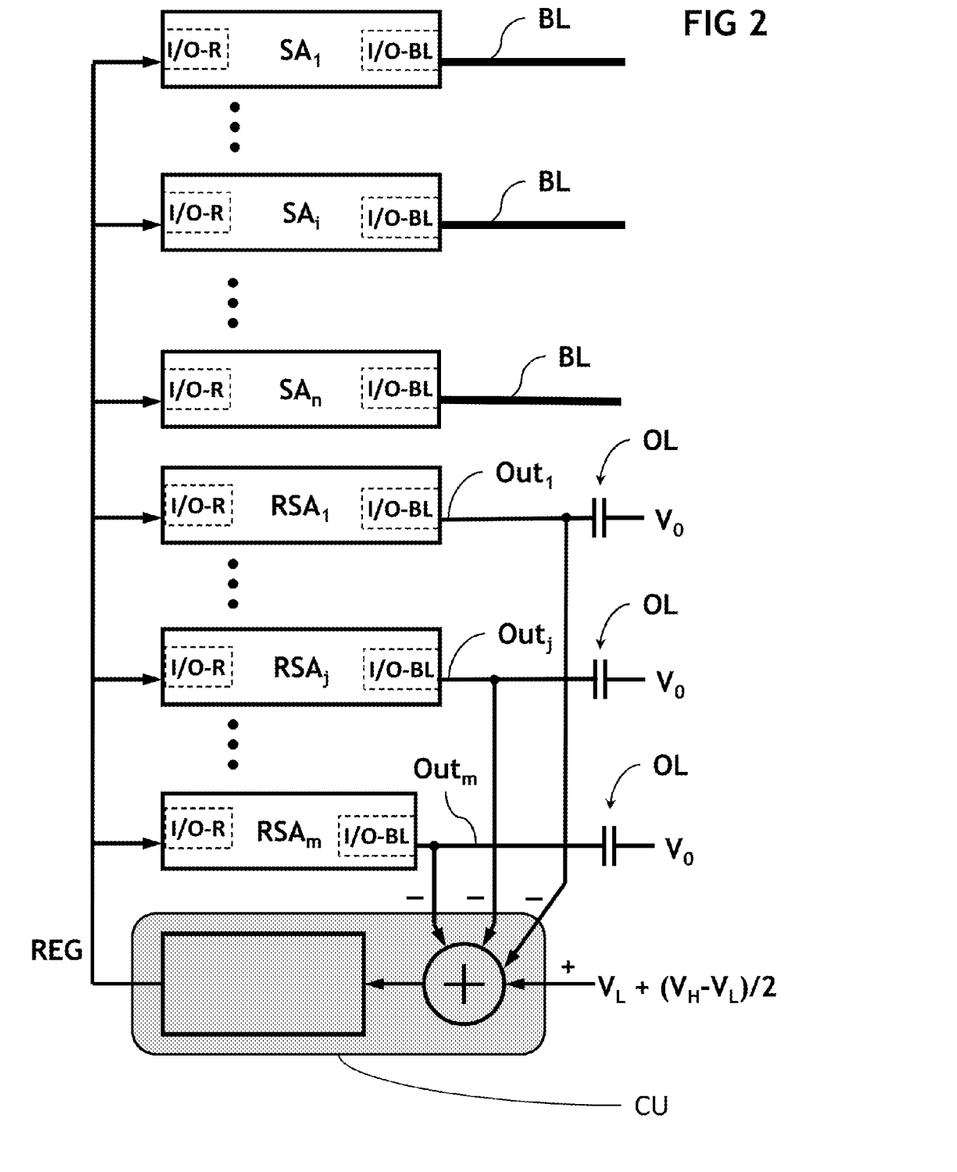
FIG. 2 is a schematic diagram that shows an embodiment of a semiconductor memory device of the invention comprising a series of sense amplifier circuits associated with a series of reference circuits connected to a control unit for compensating the effect of PVT induced variations.

FIG. 2 schematically illustrates the principles of the invention. A series of sense amplifier circuits $SA_i$, i=1 . . . n, are provided for reading data sensed from selected memory cells in a memory array. For example, the sense amplifier circuits $SA_i$ may be similar to the one of FIG. 1, but they may be of any type of sense amplifier circuits that sense a bitline BL against an external reference voltage, i.e., against a non-in-situ generated reference voltage. All sense amplifier circuits $SA_i$ are identical.

The reference circuits $RSA_j$, j=1 . . . m, are replicas of the sense amplifier circuits, their designs are identical. In particular, the transistors of a reference circuit $RSA_j$, j=1 . . . m, are designed to exhibit the same properties as the transistors of a sense amplifier circuit $SA_i$, for example, with respect to their type, channel widths and lengths, or doping levels. All reference circuits $RSA_j$ are identical to the sense amplifier circuits $SA_i$. Accordingly, as an example, a reference circuit $RSA_j$ can be the circuit of FIG. 1 if the sense amplifier circuit $SA_i$ is also the circuit of FIG. 1.

Each sense amplifier circuit $SA_i$ and each reference circuit $RSA_j$ have:
- a bitline referred input/output terminal I/O-BL to sense data from and write data to a bitline, for example, corresponding to the second input/output node $N_2$ connected to the bitline BL for the circuit of FIG. 1;
- a reference signal referred input terminal I/O-R that may optionally also serve as a data output terminal, for example, corresponding to the first input/output node $N_1$ for the circuit of FIG. 1;
- means to evaluate the data read from a connected bitline;
- means to write back or refresh data to the connected bitline memory cell; and
- if required, means to precharge the bitline BL or any other load connected to the I/O-BL terminal.

Each reference circuit $RSA_j$ has an output $OUT_j$ connected to an input of a control unit CU, and connected to an output load OL. The output load OL can be realized by means of simple capacitors connected to a DC voltage $V_0$, as illustrated in FIG. 2. The DC voltage $V_0$ is chosen to be an appropriate operating point for the capacitors and thus, preventing dielectric breakdown and leakage. Preferably, the DC voltage $V_0$ is equal to $V_L+(V_H-V_L)/2$, with $V_L$ and $V_H$ being the low and high supply voltage levels of the operating voltages of the sense amplifier circuits $SA_i$ and reference circuits $RSA_j$, respectively, defining the logic low and high voltage levels, respectively.

Once a sensing operation is carried out as known by a skilled person, the voltages of the outputs $OUT_j$ of the reference circuits $RSA_j$ are obtained. The voltages of the outputs $OUT_j$ represent the output physical quantity from which the regulation signal REG is derived through an averaging over time and/or space. The regulation network generating the regulation signal REG provides the regulation signal REG to each sense amplifier $SA_i$ and to each reference circuit $RSA_j$.

The regulation network comprises a control unit CU configured to sum up the physical quantities of each output $OUT_j$ of the reference circuit $RSA_j$ and a target mean value. The physical quantities of the output $OUT_j$ of the reference circuit $RSA_j$ and the target mean value are summed up with opposite signs.

Each reference circuits $RSA_j$ is operated as a usual sense amplifier circuit $SA_i$. The reading result of a reference circuit $RSA_j$ results from a random process involving the PVT variations and the regulation signal REG supplied to the reference circuit $RSA_j$. The regulation signal REG supplied to a reference circuit $RSA_j$ controls the mean value, over space and time, of the physical quantity delivered on the output $OUT_j$ of the reference circuit $RSA_j$. Accordingly, PVT variations are compensated by means of the averaging of the output physical quantity performed by the regulation network and the dynamically operated reference circuits $RSA_j$.

Figure 3:
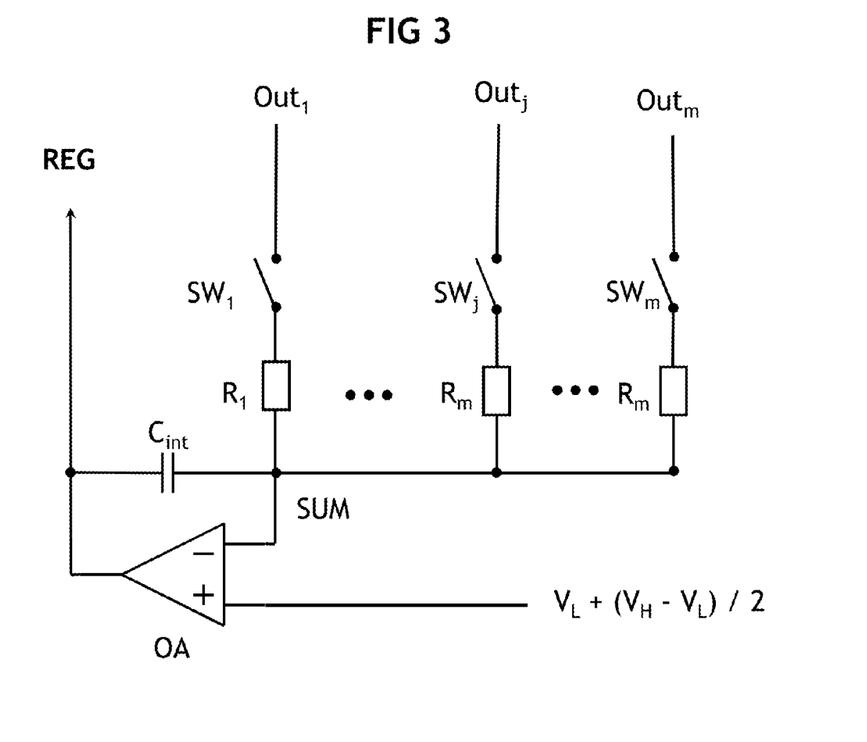
FIG. 3 is a schematic diagram of a possible embodiment of the control unit comprising an operational amplifier operated as an integrator, whose inverting input is connected through resistors and switches to the outputs of the series of reference circuits.
Figure 5:
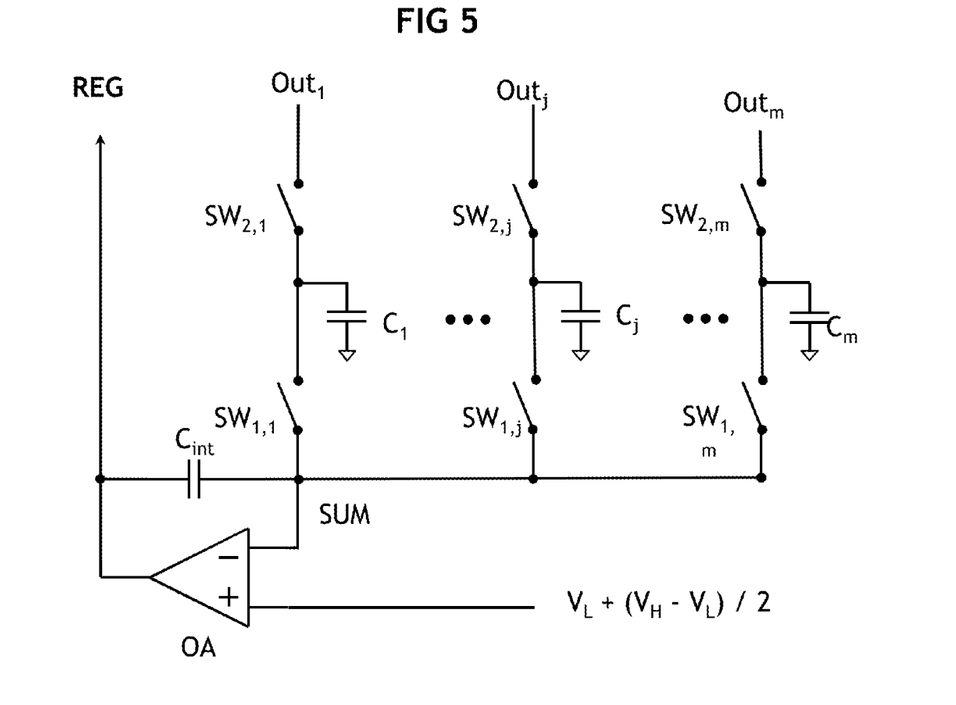
FIG. 5 is a schematic diagram of a possible embodiment of the control unit comprising an operational amplifier operated as an integrator, whose inverting input is connected through switches and switched capacitors to the outputs of the series of reference circuits.

In the exemplary embodiments depicted in FIGS. 2, 3, and 5, the control unit CU sums up the voltages of the outputs $OUT_i$ of the reference circuits $RSA_i$ with a target mean voltage acting as the target mean value. The target mean voltage equals the mean value of the operating voltages, i.e., $V_L+(V_H-V_L)/2$. The voltages of the reference circuit outputs $OUT_j$ are summed up with a negative sign whereas the target mean voltage $V_L+(V_H-V_L)/2$ is summed up with a positive sign. In such embodiments with several reference circuits $RSA_j$, the contributions of the outputs $OUT_j$ of the reference circuits $RSA_j$ are summed up and averaged in the control unit CU. In the embodiments shown in FIGS. 3 and 5 this is done at the inverting input of the operational amplifier, highlighted as node SUM in these figures.

The control unit CU then delivers the regulation signal REG based on the sum, the regulation signal REG being fed in to each regular sense amplifier circuit $SA_i$ and to each reference sense amplifier $RSA_j$.

The resulting weighted difference between the voltages of the reference circuit outputs $OUT_j$ and the target mean voltage is used to generate a regulation signal REG that is fed to the reference signal referred input terminals I/O-R of each sense amplifier circuit $SA_i$ and of each reference circuit $RSA_j$. Accordingly, the output of the control unit CU is connected to each sense amplifier circuit $SA_i$ and each reference circuit $RSA_j$.

The average over time of the summed output voltages of the reference circuit outputs $OUT_j$ equals the target mean voltage $V_L+(V_H-V_L)/2$, which is chosen to represent the expected value of sense amplifier circuit output voltages over time in the case of randomly distributed data.

Since the reference circuits $RSA_j$ and the sense amplifier circuits $SA_i$ are identical, the same PVT changes affect similarly the sense amplifier circuits $SA_i$ and the reference circuits $RSA_j$. PVT changes lead to shifts of the required input voltages at reference signal referred input terminals I/O-R for proper operation of the reference circuit output $OUT_j$, and in turn the entire circuit acts as a balanced regulation loop providing the regulation signal REG generated by the control unit CU.

The regulated regulation signal REG compensates for all kinds of PVT variation induced drifts and maintains proper operation of all sense amplifier circuits $SA_i$ within a larger circuit such as a memory array, independently of PVT variations. It shall be noted that the regulation signal REG is described as a voltage in the described examples (FIGS. 3, 5, 6), but it may also be a current.

For example, the regulation signal REG may be used as the reference signal REF in the sense amplifier circuit of FIG. 1 as a reference for sensing operations. Alternatively, the regulation signal REG may be a voltage used to control the second control gate (i.e., back control gate) of one or more transistors of each sense amplifier circuit $SA_i$ and each reference circuit $RSA_j$. The reference signal REF may then be provided externally to the sense amplifier $SA_i$ and the regulation signal REG may be applied to the back control gate $BG_2$ of the transistor $T_2$, or to the back control gate $BG_3$ of transistor $T_3$. The regulation signal REG generated by the control unit CU may be extended by further control signals set externally. In the above-mentioned example, the back control gate $BG_2$ of the transistor $T_2$ may be controlled by the regulation signal REG while the back control gate $BG_3$ of transistor $T_3$ is controlled by an external voltage, or conversely, the back control gate $BG_3$ of the transistor $T_3$ may be controlled by the regulation signal REG while the back control gate $BG_2$ of transistor $T_2$ is controlled by an external voltage.

Further, instead of using FDSOI (Fully-Depleted Silicon-On-Insulator) devices with a front gate and a back control gate, any kind of double gate transistors can be used in the structure displayed in FIG. 1, which is a non-limiting example. Moreover it should be noted, that principle and embodiments described in FIGS. 2 through 6 do not require a single-ended sense amplifier realized in FDSOI or any other kind of double-gate technology, but can be applied to single-ended sense amplifiers realized in standard bulk CMOS technologies as well.

FIG. 3 shows a possible structure for the control unit CU. Each of the reference circuit outputs $OUT_j$ is connected to the control unit CU through at least one switch $SW_j$ that allows decoupling the control unit CU from the reference circuit outputs $OUT_j$ prior and during sensing operations of the sense amplifier circuits $SA_i$ and of the reference circuits $RSA_j$. The switches ensure that the outputs $OUT_j$ of the reference circuits $RSA_j$ are connected to the control unit CU only during the time frames after a decision has been made in the sensing operation and prior to the next operation step.

The signals of the reference circuit outputs $OUT_j$ are summed up at a common node SUM in FIG. 3. In this embodiment, the control unit CU comprises an operational amplifier OA with an inverting input and a non-inverting input, the target mean voltage being applied to the non-inverting input while the inverting input represents the summing node SUM.

The control unit CU further comprises an integrator or a low pass filter achieved through the depicted configuration, wherein resistors $R_j$ are arranged between each reference circuit output $OUT_j$ and the inverting input of the operational amplifier OA, with a common capacitor $C_{int}$. In more detail, the resistors $R_j$ are arranged between the switches $SW_j$ and the summing node SUM, while the common capacitor $C_{int}$ is arranged between the summing node SUM and the output of the operational amplifier OA.

Figure 4A:
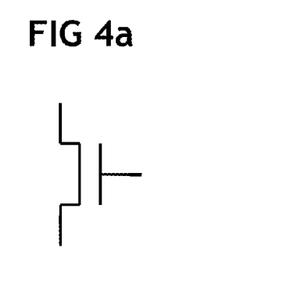
FIGS. 4a and 4b shows two possible embodiments for the switches.

FIGS. 4a and 4b show two examples of switches that may be used. The switch illustrated in FIG. 4a is a single transistor operated at sufficiently high overdrive voltage to ensure an adequate transmission of the output voltages of the reference circuits $RSA_j$. The transistor can be any FET, i.e., any field effect transistor.

Figure 4B:
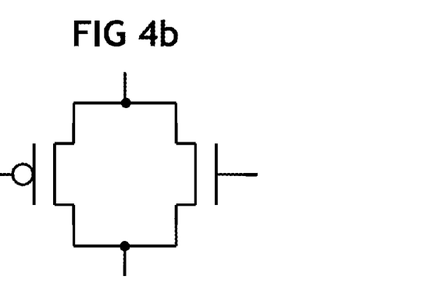

The switch illustrated in FIG. 4b is a transmission gate, wherein a P-type transistor 41 is associated in parallel with an N-type transistor 42. With this configuration, the two transistors are operated in parallel in order to achieve an overall lower on-resistance and decreased dependence of the resistance on the voltage to be switched. The transistors can be any FET transistors.

FIG. 5 shows another possible structure for the control unit CU, which is similar to the structure illustrated in FIG. 3, but the resistors $R_j$ are replaced by switched capacitors $C_j$. One of the terminals of each capacitor $C_i$ is connected between a first switch $SW_j$ and a second switch $SW_{c,j}$, and the second terminal of the capacitor $C_i$ is grounded or connected to any other DC voltage. The switches $SW_j$ and $SW_{c,j}$, connect the capacitors $C_j$ alternatively to the outputs $OUT_j$ of the reference circuit $RSA_j$, to the common summing node SUM, or also disconnect them from both nodes, respectively. The first switch $SW_j$ serves also as previously for decoupling the control unit CU from the reference circuit outputs $OUT_j$ and during sensing operations of the reference circuits $RSA_j$. For example, the switches $SW_j$ and $SW_{c,j}$, can be those illustrated in FIG. 4.

Figure 6:
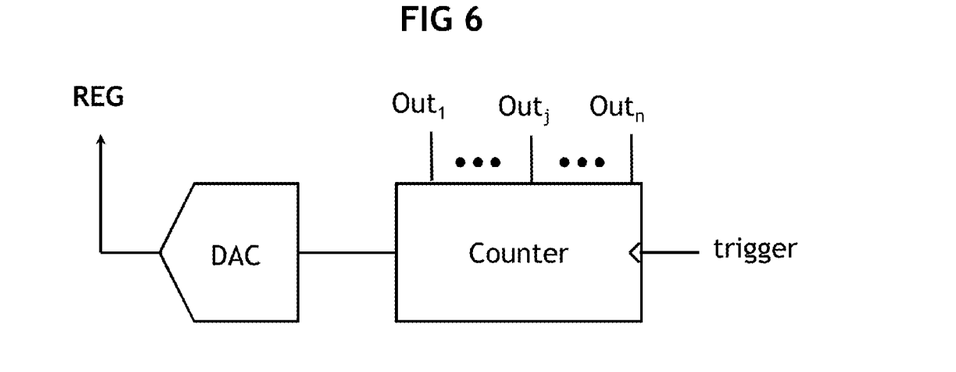
FIG. 6 is a schematic diagram of a possible embodiment of the control unit comprising a digital up-down counter and a digital-to-analog converter.

FIG. 6 shows an alternative embodiment wherein the summation and integration are realized in the digital domain and the regulation signal REG is generated through a digital-to-analog converter DAC. A digital up/down counter CNT is used to calculate the average of the summed output data of the reference circuits $RSA_j$. An up/down counter is a counter that can increment or decrement its value depending on the logic input data.

Each reference circuit output $OUT_j$ is connected to an input of the digital up-down counter CNT, from which data are read into the counter CNT, controlled by a trigger signal TRG, after decision-making by the reference circuits $RSA_j$.

The counter output is fed to the digital-to-analog converter DAC, which provides the regulation signal REG in the analog domain for the reference circuits $RSA_j$ as well as for the sense amplifier circuits $SA_i$. It is optionally possible to design the up/down counter CNT in a manner that it only makes a step if the absolute value of the summed output voltages of the reference circuits $RSA_j$ is superior to a given integer number d, e.g., d=2, 3, . . . . This allows a decrease in switching activity, and a lower power consumption. The regulation signal REG is generated through averaging the voltages of the reference circuit outputs $OUT_j$, which represent the binary input data of this fully digital implementation of the circuit configuration.

Averaging may be made in the time-domain, as described in the discussed embodiments, but may also be made only in the space-domain, by using enough reference circuits $RSA_j$ for an acceptable averaging. Mixed time- and space domain averaging is possible as well.

Hence, the integrator of the embodiments depicted in FIGS. 3 and 5 can be omitted and replaced by another integrating function, for instance a simpler integrating function in case of a sufficiently high number of reference circuits $RSA_j$ for compensating for the lack of the integrator mentioned above. The same reasoning applies for the up/down counter CNT of the embodiment of FIG. 6. The control unit CU can then be implemented on a more limited area.

Generally speaking, in each configuration, using a larger number of reference circuits $RSA_j$ leads to faster settling of the regulation signal REG.

The invention claimed is:

1. A semiconductor memory device comprising:
at least one sense amplifier circuit ($SA_i$) for reading data sensed from selected memory cells in a memory array;
at least one reference circuit ($RSA_j$), each reference circuit ($RSA_j$) being a replica of the sense amplifier circuit ($SA_i$) and having an output ($OUT_j$) through which the reference circuit ($RSA_j$) delivers an output physical quantity;
a regulation network providing a regulation signal (REG) to each sense amplifier circuit ($SA_i$) and each reference circuit ($RSA_j$), wherein the regulation signal (REG) is derived from an averaging of the output physical quantity over time and/or space;
wherein the regulation network comprises a control unit (CU) configured to sum up the physical quantities of each output ($OUT_j$) of the reference circuit ($RSA_j$) and a target mean value, wherein the physical quantities of the output ($OUT_j$) of the reference circuit ($RSA_j$) and the target mean value are summed up with opposite signs, the control unit delivering a regulation signal (REG) based on the sum, the regulation signal (REG) being fed in to each regular sense amplifier circuit ($SA_i$) and to each reference circuit ($RSA_j$).

2. The semiconductor memory device of claim 1, wherein the target mean value is a voltage of VL+(VH−VL)/2, with VL and VH, respectively, being low and high voltage levels of the operating voltages of the sense amplifier circuits ($SA_i$) and reference circuits ($RSA_j$), defining the respective low and high logic levels.

3. The semiconductor memory device of claim 1, wherein each of the reference circuit outputs ($OUT_j$) is connected to a capacitor connected to a DC voltage ($V_0$).

4. The semiconductor memory device of claim 1, wherein the regulation signal (REG) is an average over time and/or over space of the difference between the sum of the output physical quantities of each reference circuit ($RSA_j$) and the target mean value.

5. The semiconductor memory device of claim 1, wherein the regulation signal (REG) is a voltage used as a reference voltage by each sense amplifier circuit ($SA_i$) and by each reference circuit ($RSA_j$).

6. The semiconductor memory device of claim 1, wherein the control unit (CU) comprises an operational amplifier (OA) with an inverting input and a non-inverting input, the target mean value being applied to the non-inverting input while the inverting input is connected to each reference circuit output ($OUT_j$) through at least one switch and/or resistor and/or capacitor.

7. The semiconductor memory device of claim 6, wherein each reference circuit output ($OUT_j$) is connected to the control unit (CU) through at least one switch ($SW_j$) that allows decoupling the control unit (CU) from the output ($OUT_j$) prior and during sensing operations of the at least one sense amplifier circuit ($SA_i$) and of the at least one reference circuit ($RSA_j$).

8. The semiconductor memory device of claim 6, wherein the control unit (CU) comprises an integrator.

9. The semiconductor memory device of claim 8, wherein the integrator comprises resistors ($R_j$) connected to each reference circuit output ($OUT_j$) and to a summing node (SUM), and a common integration capacitor ($C_{int}$).

10. The semiconductor memory device of claim 8, wherein the integrator comprises a switched capacitor configuration ($C_j$) associated with each reference circuit output ($OUT_j$).

11. The semiconductor memory device of claim 1, wherein the control unit comprises:
   a digital up/down counter (CNT), each reference circuit output ($OUT_j$) being connected to an input of the digital up-down counter (CNT); and
   a Digital-to-Analog Converter (DAC) for converting the digital output signal of the digital up/down counter (CNT) into the regulation signal (REG) to be fed in to each sense amplifier circuit ($SA_i$) and to each reference circuit ($RSA_j$).

12. A semi-conductor memory comprising a semiconductor memory device according to claim 1.

13. The semiconductor memory device of claim 2, wherein each of the reference circuit outputs ($OUT_j$) is connected to a capacitor connected to a DC voltage ($V_0$).

14. The semiconductor memory device of claim 13, wherein the regulation signal (REG) is an average over time and/or over space of the difference between the sum of the output physical quantities of each reference circuit ($RSA_j$) and the target mean value.

15. The semiconductor memory device of claim 14, wherein the regulation signal (REG) is a voltage used as a reference voltage by each sense amplifier circuit ($SA_i$) and by each reference circuit ($RSA_j$).

16. The semiconductor memory device of claim 15, wherein the control unit (CU) comprises an operational amplifier (OA) with an inverting input and a non-inverting input, the target mean value being applied to the non-inverting input while the inverting input is connected to each reference circuit output ($OUT_j$) through at least one switch and/or resistor and/or capacitor.

17. The semiconductor memory device of claim 16, wherein each reference circuit output ($OUT_j$) is connected to the control unit (CU) through at least one switch ($SW_j$) that allows decoupling the control unit (CU) from the output ($OUT_j$) prior and during sensing operations of the at least one sense amplifier circuit ($SA_i$) and of the at least one reference circuit ($RSA_j$).

18. The semiconductor memory device of claim 17, wherein the control unit (CU) comprises an integrator.

19. The semiconductor memory device of claim 18, wherein the integrator comprises resistors ($R_j$) connected to each reference circuit output ($OUT_j$) and to a summing node (SUM), and a common integration capacitor ($C_{int}$).

20. A process of operating a semiconductor memory device, comprising the steps of:
   providing a semiconductor memory device including:
      at least one sense amplifier circuit ($SA_i$) for reading data sensed from selected memory cells in a memory array;
      at least one reference circuit ($RSA_j$), each reference circuit ($RSA_j$) being a replica of the sense amplifier circuit ($SA_i$) and having an output ($OUT_j$) through which the reference circuit ($RSA_j$) delivers an output physical quantity;
      a regulation network providing a regulation signal (REG) to each sense amplifier circuit ($SA_i$) and each reference circuit ($RSA_j$), wherein the regulation signal (REG) is derived from an averaging of the output physical quantity over time and/or space;
      wherein the regulation network comprises a control unit (CU) configured to sum up the physical quantities of each output ($OUT_j$) of the reference circuit ($RSA_j$) and a target mean value, wherein the physical quantities of the output ($OUT_j$) of the reference circuit ($RSA_j$) and the target mean value are summed up with opposite signs, the control unit delivering a regulation signal (REG) based on the sum, the regulation signal (REG) being fed in to each regular sense amplifier circuit ($SA_i$) and to each reference circuit ($RSA_j$);
   operating similarly each sense amplifier circuit ($SA_i$) and each reference circuit ($RSA_j$);
   generating a regulation signal (REG) in the regulation network from the physical quantities of each output ($OUT_j$) of the reference circuits ($RSA_j$) and applying the regulation signal (REG) to the sense amplifier circuit ($SA_i$) and the reference circuits ($RSA_j$).

* * * * *